United States Patent

Gramling et al.

[11] Patent Number: 5,414,362
[45] Date of Patent: May 9, 1995

[54] DEVICE FOR VERIFYING THE WIRING OF AN ELECTRICAL RECEPTACLE FOR A TOWED VEHICLE

[76] Inventors: Don Gramling, 3306 Hwy. 135 N.; L. T. Botkins, 2910 Oak Dr., both of Paragould, Ark. 72450

[21] Appl. No.: 181,817

[22] Filed: Jan. 18, 1994

[51] Int. Cl.⁶ .............................................. G01R 31/02
[52] U.S. Cl. ........................... 324/503; 324/133; 324/504; 340/431
[58] Field of Search ............... 324/503, 504, 508, 538, 324/555, 556, 133; 340/431, 651

[56] References Cited

U.S. PATENT DOCUMENTS

| | | | |
|---|---|---|---|
| 3,836,843 | 9/1974 | Yonce | 324/504 |
| 3,904,958 | 9/1975 | Gartland, Jr. et al. | 324/508 |
| 3,944,915 | 3/1976 | Yonce | 324/504 |
| 4,122,434 | 10/1978 | Jensen . | |
| 4,166,242 | 8/1979 | Spiteri | 324/504 |
| 4,249,125 | 3/1981 | Carver | 324/504 |
| 4,547,722 | 10/1985 | Sarlo | 324/504 |
| 4,586,370 | 5/1986 | Massender . | |
| 5,086,277 | 2/1992 | Hammerly | 324/504 |
| 5,095,276 | 3/1992 | Nepil | 324/504 |

*Primary Examiner*—Kenneth A. Wieder
*Assistant Examiner*—Diep Do
*Attorney, Agent, or Firm*—Norman B. Rainer

[57] ABSTRACT

A device for testing a multi-terminal electrical service receptacle on a towing vehicle includes an electrically insulative body of elongated shape having forward and rearward faces. Electrical contacts are disposed in the forward face to engage the terminals of the receptacle. Light-emitting devices such as bulbs are disposed in the rearward face, and are connected by way of electrical conductors to the corresponding contacts in the forward surface. During use of the device, the illumination of a particular light signifies the validity of the corresponding electrical circuit involving features of the towing vehicle.

3 Claims, 2 Drawing Sheets

DEVICE FOR VERIFYING THE WIRING OF AN ELECTRICAL RECEPTACLE FOR A TOWED VEHICLE

BACKGROUND OF THE INVENTION

1. Field of the Invention

This invention concerns a testing device, and more particularly relates to the testing of electrical circuits extending between a trailered recreational vehicle and associated towing vehicle.

2. Description of the Prior Art

Recreational trailer vehicles currently in widespread use for travel upon public highways utilize various electrically activated features. For example, running lights are positioned at the rear, and sometimes on the sides of the trailered vehicle. Brake lights, responsive to the braking action of the operator of the towed vehicle, are disposed upon the rear of the trailered vehicle. When the trailered vehicle contains living quarters, there may be various electrical appliances that operate off the generator or battery of the towing vehicle.

In order to provide proper electrical service to a trailered vehicle, the towing vehicle is generally provided with a multi-functional electrical receptacle intended to removably connect with appropriate electrical circuitry in the trailered vehicle. However, such receptacles are generally added to the towing vehicle in individually customized installations. Most manufacturers of recreational vehicle (RV) trailers wire their trailers to the same color code to make it easier to achieve proper connection to towing vehicles. On occasion, due to the complexity of a towing vehicle, or the special requirements of the trailered vehicle, or the installer's inexperience or mistake, the receptacle may be improperly wired, or shorted, namely incorrectly attached to the appropriate electrical conductors or sources of the towing vehicle.

Devices and systems for determining the accuracy of electrical and other coupling features between vehicular trailers and the associated towing vehicle are disclosed in U.S. Pat. Nos. 4,122,434; 4,547,722; 4,586,370; 5,086,277 and 5,095,276. However, said devices and systems are generally very complex, and are intended as permanent installations for continuously monitoring the status of the coupling features, even while the vehicles are in motion.

It is accordingly an object of the present invention to provide a device for testing an electrical service receptacle for a trailered vehicle.

It is another object of this invention to provide a device of the aforesaid nature which removably associates with said receptacle.

It is a further object of the present invention to provide a device of the aforesaid nature which is quick and easy to use, and of simple, rugged construction amenable to low cost manufacture.

These and other beneficial objects and advantages will be apparent from the following description.

SUMMARY OF THE INVENTION

The above and other beneficial objects and advantages are accomplished in accordance with the present invention by a device for testing a multi-contact electrical service receptacle on a towing vehicle, said device comprising:

a) an electrically insulative body of elongated, substantially cylindrical shape having a rearward face extremity, and a substantially flat forward face extremity orthogonally disposed to the axis of elongation of said insulative body, b) a series of electrical contacts disposed in said forward face extremity and spaced apart and configured to engage the corresponding contacts of said receptacle, c) a series of light-emitting members disposed in said rearward face extremity and corresponding to the electrical contacts in said forward face extremity, and d) electrical conductors disposed within said insulative body in communication between each electrical contact on said forward face extremity and corresponding light-emitting member in said rearward face extremity.

BRIEF DESCRIPTION OF THE DRAWING

For a fuller understanding of the nature and objects of the invention, reference should be had to the following detailed description taken in connection with the accompanying drawing forming a part of this specification and in which similar numerals of reference indicate corresponding parts in all the figures of the drawing.

DESCRIPTION OF THE PREFERRED EMBODIMENT

Figure 1:
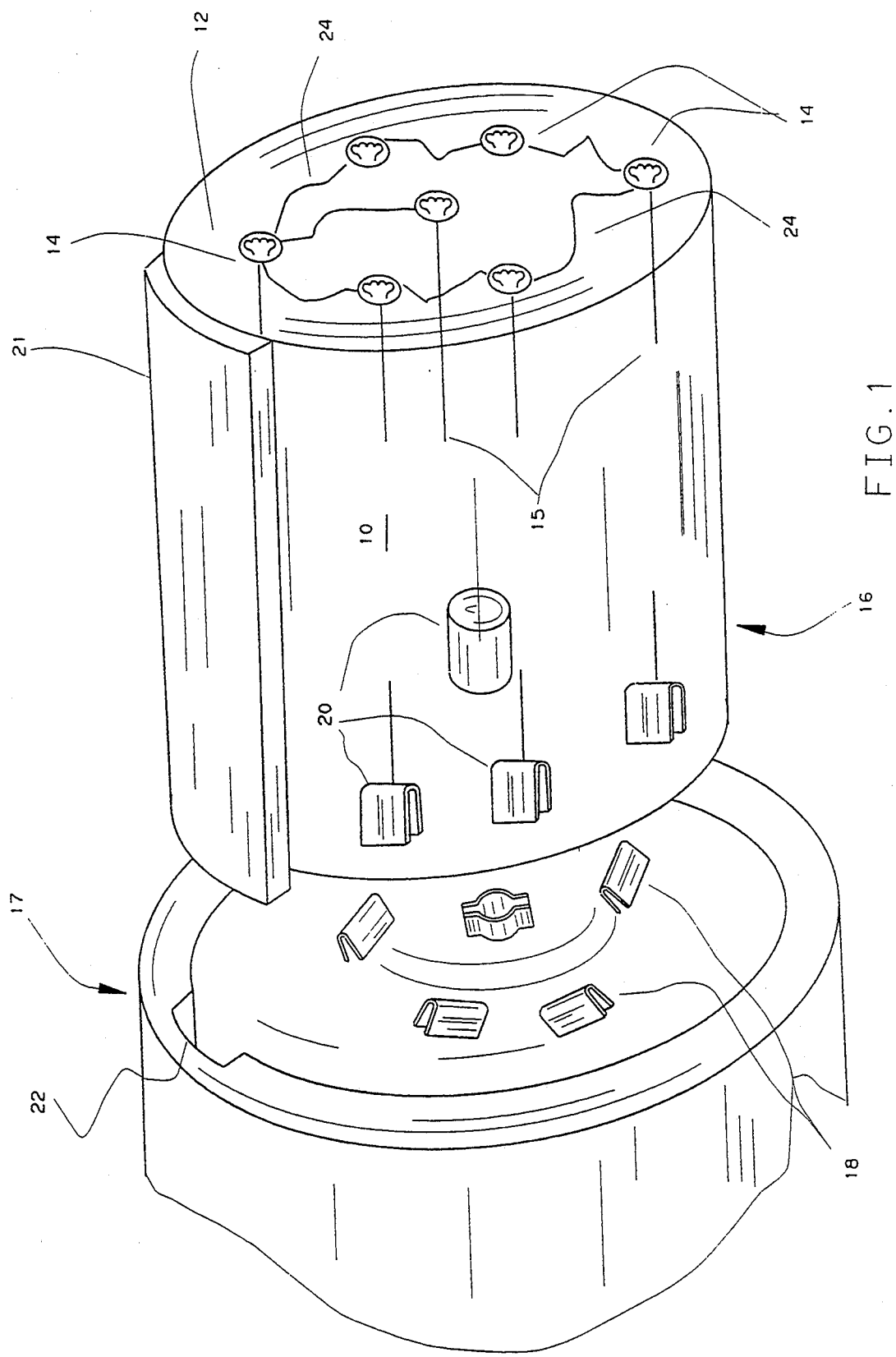
FIG. 1 is a perspective view of an embodiment of the testing device of the present invention with portions broken away to reveal interior details.
Figure 3:
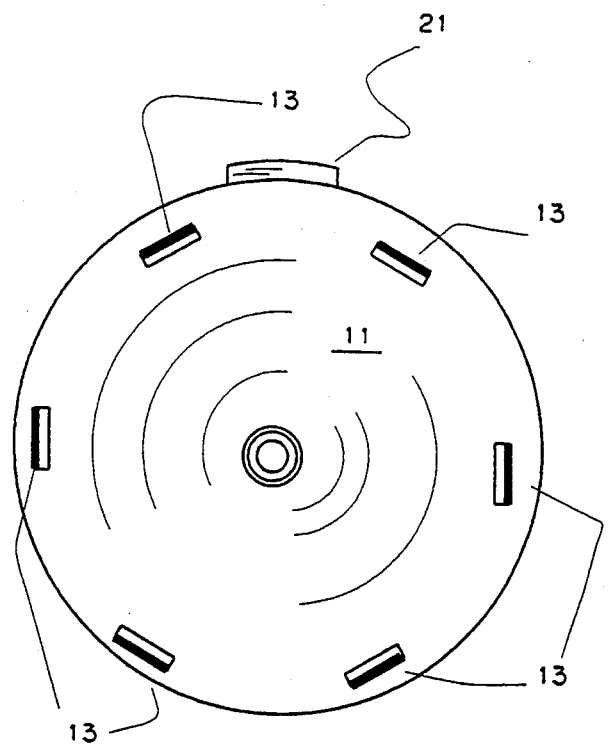
FIG. 3 is an end view taken from the left of FIG. 1.
Figure 2:
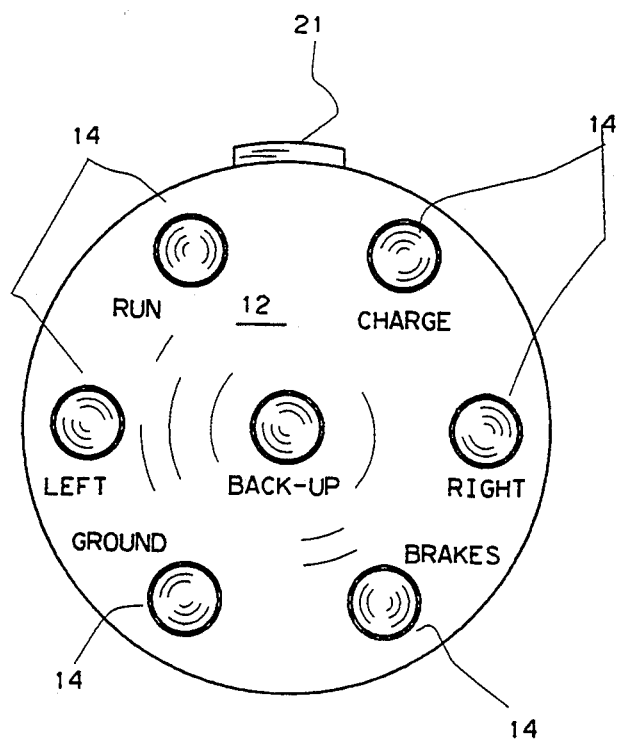
FIG. 2 is an end view taken from the right of FIG. 1.

Referring to FIGS. 1-3, an embodiment of the testing device 16 of the present invention is shown aligned to receive multi-functional receptacle 17 of a towing vehicle. The device 16 is comprised of electrically insulative body 10 of cylindrical shape having flat forward and rearward face extremities 11 and 12, respectively. In alternative embodiments, rearward face 12 may be angularly disposed to said axis and may be of non-flat configuration. Said body 10 may typically have a length in the range of 3" to 6" and a diameter in the range of $1\frac{1}{2}$" to $1\frac{3}{4}$". The body is fabricated of an electrically non-conductive material, preferably a moldable plastic material such as polyvinylchloride, polyethylene, ABS (acrylonitrile, butadiene, styrene copolymer), polyacetal or other equivalent polymer. Body 10 may be of solid or hollow construction.

Forward face 11 is provided with a series of recessed slots 13, each containing electrical contacts 20. The slots are spaced apart and configured to engage the corresponding terminals 18 of said receptacle, which in the exemplified embodiment, are shown as male prong contact posts. Each male contact post is adapted to supply 12 volt D.C. current from the towing vehicle.

Rearward face 12 is provided with a series of light-emitting members such as mini bulbs 14 activatable by 12 volt D.C. current. Other equivalent light-emitting devices might alternatively be employed. The bulbs may produce the same color or different colors of light, said colors serving as recognition codes for the several electrical circuits. Printed indicia may be disposed upon said rearward face to further identify each light and its corresponding electrical circuit. For example the indicated circuits may include: running lights, left and right turn signal lights, trailer brakes, ground circuit, generator charging circuit, and reverse or back-up lights.

Electrical conductors 15 are shown extending between said forward and rearward faces, with a continuous ground wire 24 interconnecting the bulbs, causing electrical communication between slots 13 and corresponding bulbs 14 and thereby completing an electrical circuit that permits activation of the bulbs. A jumper wire from the charge circuit feeds the positive side of the ground bulb.

Ground wire 24 interconnects all negative terminals of the bulbs and extends to the forward face and connected to the slot representing "Ground". Such manner of interconnection enables an installer to verify that the tow vehicle receptacle 17 is connected to a good ground. If no lights operate, it signifies inadequate ground connection.

In alternative embodiments, printed conductor pathways may be employed instead of conductor wires, and in some embodiments, a single conductor in combination with a common ground connection may be sufficient to complete an electrical circuit to activate the bulb.

A tab 21 upraised from the cylinder sidewall extends to forward face 11, and is dimensioned to insertively engage a receiving slot 22 associated with receptacle 17 of the towing vehicle. Such arrangement assures accurate interengagement of the device with receptacle 17.

In operation, forward face 11 of the device is pushed into engagement with receptacle 17, causing electrical terminal prongs 18 to enter the corresponding slots 13 of said forward face. Each bulb will light up when that particular circuit is activated. For example, when the device is initially engaged with receptacle 17, only the charge and ground bulbs should glow. If anything other than this occurs, there is an error in the wiring. When only the headlights or parking lights are turned on, only the charge, ground and run bulbs should glow. With only the left turn signal indicator turned on, only the charge and ground bulbs should glow steadily, and the bulb marked "left" should be blinking. If all bulbs function accordingly, the tow vehicle is correctly wired. In such case, the device is removed and the receptacle is attached to the appropriate receiving junction of the trailered vehicle.

While particular examples of the present invention have been shown and described, it is apparent that changes and modifications mat be made therein without departing from the invention in its broadest aspects. The aim of the appended claims, therefore, is to cover all such changes and modifications as fall within the true spirit and scope of the invention.

Have thus described our invention, what is claimed is:

1. A device for testing a multi-terminal electrical service receptacle on a towing vehicle, said device comprising:
    a) an electrically insulative body of elongated circular cylindrical shape having a rearward face extremity, and a substantially flat forward face extremity orthogonally disposed to the axis of elongation of said insulative body and having an upraised tab configured to mate with said service receptacle to ensure accurate interengagement of said device with said receptacle,
    b) a series of electrical contacts disposed in slots recessed in said forward face extremity and spaced apart and configured to engage the corresponding terminals of said receptacle, one of said contacts being a ground contact,
    c) a series of light-emitting members disposed in said rearward face extremity corresponding to the electrical contacts in said forward face extremity, said light-emitting members having negative terminals, all of which are connected by a ground wire that joins said ground contact, and
    d) electrical conductors disposed within said insulative body in communication between each electrical contact on said forward face extremity and corresponding light-emitting member in said rearward face extremity, thereby forming electrical circuits when including electrical features of said towing vehicle.

2. The device of claim 1 wherein said body has a length in the range of 3 to 6 inches and a diameter in the range of 1½ to 2 inches.

3. The device of claim 2 wherein indicia is disposed upon said rearward face to identify each light-emitting member and corresponding electrical circuit.

* * * * *